United States Patent
Shilimkar et al.

(10) Patent No.: US 10,672,703 B2
(45) Date of Patent: Jun. 2, 2020

(54) TRANSISTOR WITH SHIELD STRUCTURE, PACKAGED DEVICE, AND METHOD OF FABRICATION

(71) Applicant: NXP USA, Inc., Austin, TX (US)

(72) Inventors: Vikas Shilimkar, Chandler, AZ (US); Kevin Kim, Gilbert, AZ (US); Hernan Rueda, Chandler, AZ (US); Humayun Kabir, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/142,713

(22) Filed: Sep. 26, 2018

(65) Prior Publication Data
US 2020/0098683 A1    Mar. 26, 2020

(51) Int. Cl.
| | |
|---|---|
| *H01L 23/522* | (2006.01) |
| *H01L 23/528* | (2006.01) |
| *H01L 23/31* | (2006.01) |
| *H01L 21/56* | (2006.01) |
| *H01L 27/088* | (2006.01) |
| *H01L 21/8234* | (2006.01) |

(52) U.S. Cl.
CPC .......... *H01L 23/5225* (2013.01); *H01L 21/56* (2013.01); *H01L 21/823475* (2013.01); *H01L 23/3135* (2013.01); *H01L 23/3171* (2013.01); *H01L 23/528* (2013.01); *H01L 23/5228* (2013.01); *H01L 27/088* (2013.01); *H01L 23/5226* (2013.01)

(58) Field of Classification Search
CPC ............ H01L 23/5225; H01L 23/5228; H01L 23/3135; H01L 23/3171; H01L 23/5226; H01L 21/56; H01L 21/823475; H01L 27/088
See application file for complete search history.

(56) References Cited

U.S. PATENT DOCUMENTS

| | | | |
|---|---|---|---|
| 5,406,117 A | 4/1995 | Dlugokecki et al. | |
| 5,694,300 A | 12/1997 | Mattei et al. | |
| 7,221,034 B2 | 5/2007 | Ma et al. | |
| 7,432,133 B2 | 10/2008 | Condie et al. | |
| 7,435,625 B2 | 10/2008 | Condie et al. | |
| 9,653,410 B1* | 5/2017 | Holmes | H01L 23/528 |
| 2001/0015490 A1 | 8/2001 | Lee | |
| 2001/0049912 A1 | 12/2001 | Motonari et al. | |
| 2004/0238941 A1 | 12/2004 | Satoh et al. | |
| 2005/0189588 A1* | 9/2005 | Ma | H01L 21/76898 257/343 |
| 2007/0030661 A1* | 2/2007 | Morris | C23C 30/00 361/818 |

(Continued)

OTHER PUBLICATIONS

Non Final Office Action; U.S. Appl. No. 16/293,357; 15 pages (dated Jan. 16, 2020).

*Primary Examiner* — Feifei Yeung Lopez
(74) *Attorney, Agent, or Firm* — Charlene R. Jacobsen (57) ABSTRACT

A transistor includes a semiconductor substrate having an active device region formed therein and an interconnect structure on a first surface of the semiconductor substrate. The interconnect structure is formed of multiple layers of dielectric material and electrically conductive material. Drain and gate runners are formed in the interconnect structure. A shield structure extends above a second surface of the interconnect structure, the shield structure being positioned between the drain and gate runners.

15 Claims, 6 Drawing Sheets

(56) References Cited

U.S. PATENT DOCUMENTS

| | | |
|---|---|---|
| 2007/0090545 A1 | 4/2007 | Condie et al. |
| 2010/0246152 A1 | 9/2010 | Lin et al. |
| 2011/0102077 A1 | 5/2011 | Lamey et al. |
| 2011/0278736 A1 | 11/2011 | Lin et al. |
| 2014/0103420 A1 | 4/2014 | Liu et al. |
| 2015/0163958 A1* | 6/2015 | Oguma .............. H05K 7/20463 264/36.22 |
| 2015/0214141 A1 | 7/2015 | Ye et al. |

* cited by examiner

FIG. 1

PRIOR ART

FIG. 2

PRIOR ART

FIG. 3

PRIOR ART

TRANSISTOR WITH SHIELD STRUCTURE, PACKAGED DEVICE, AND METHOD OF FABRICATION

TECHNICAL FIELD OF THE INVENTION

The present invention relates generally to field effect transistors. More specifically, the present invention relates to a transistor having a shield structure for reducing parasitic capacitance and losses resulting from encapsulating material.

BACKGROUND OF THE INVENTION

In semiconductor device fabrication, integrated circuits are typically encapsulated with a plastic encapsulating material that functions to prevent physical damage and corrosion, to provide effective heat dissipation, and so forth. However, the encapsulating material can add significant parasitic feedback capacitances and losses due to the encapsulating material. These parasitic feedback capacitances and losses can adversely affect the performance of transistors within an integrated circuit in terms of gain and stability.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a transistor having a shield structure formed above an interconnect structure of the transistor, a packaged device having such a transistor, and a method of manufacturing that includes the transistor. More specifically, embodiments can include multiple shield structures formed by an electrically conductive layer strategically located above the interconnect structure between drain and gate runners of a multiple runner interdigitated transistor. The shield structures are covered by a dielectric protective coating. Thereafter, the transistor can be encapsulated with an encapsulating material during integrated circuit packaging. The presence of the shield structures and dielectric protective coating raises the encapsulating material away from the gate and drain runners, thereby reducing electric coupling between the gate and drain runners. The integration of the shield structure may effectively increase the gain of the active device (e.g., transistor) without degrading stability by reducing feedback capacitance.

The following description entails the implementation of a shield structure located above an interconnect structure of a field effect transistor (FET) in a non-limiting fashion. Multiple shield structures may be strategically located between the drain and gate runners of a multiple runner interdigitated FET. It should be understood, however, that the shield structure may be implemented within a wide variety of unipolar and bipolar transistor technologies.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
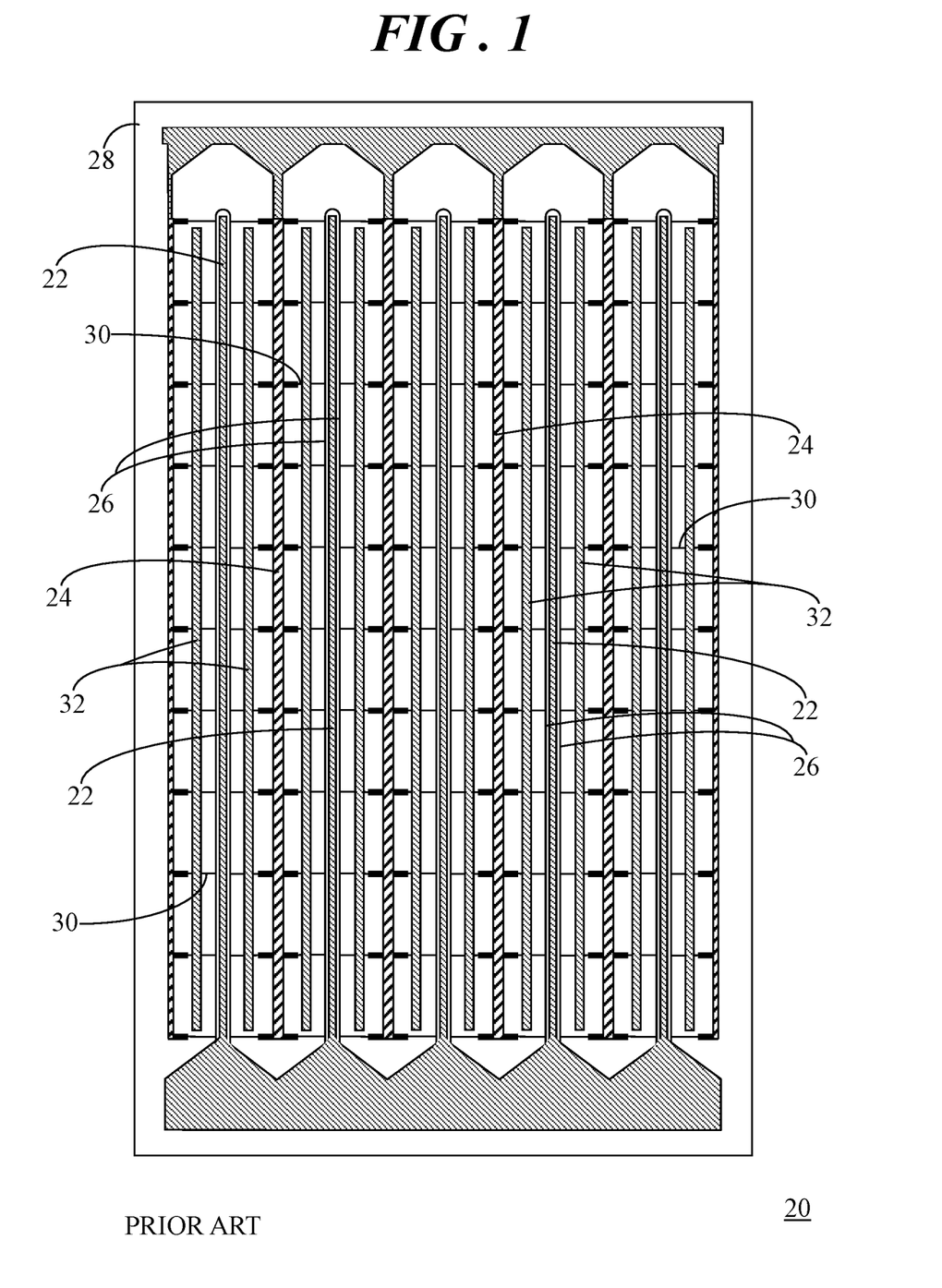
FIG. 1 shows a simplified top view of an example of a transistor having interdigitated drain and gate fingers.

FIG. 1 shows a simplified top view of an example of a transistor 20 having interdigitated drain and gate runners 22, 24. That is, drain and gate runners 22, 24 are closely positioned relative to one another in an alternating arrangement. Gates 26 generally surround drain regions (not visible) formed within a semiconductor substrate 28 of an intrinsic device underlying drain and gate runners 22, 24. Transistor 20 further includes a plurality of tap interconnects 30 formed from electrically conductive material, typically metal. Tap interconnects 30 are electrically connected between gate runners 24 and gate taps or gate electrodes of gates 26 formed within semiconductor substrate 28. Transistor 20 may include shield runners 32 interposed between each pair of drain and gate runners 22, 24 that may reduce some feedback capacitance between drain and gate runners 22, 24. The interdigitated drain, gate, and shield runners 22, 24, 32 may be formed in one or more metal layers above semiconductor substrate 28.

Figure 2:
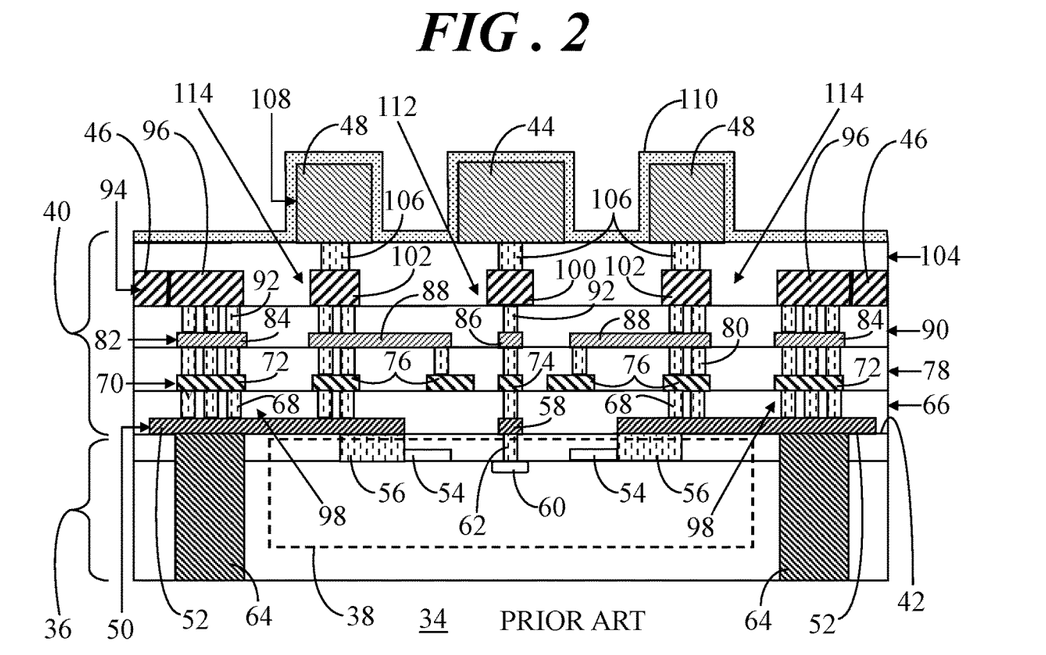
FIG. 2 shows a side sectional view of a portion of a prior art transistor.

Referring now to FIG. 2, FIG. 2 shows a side sectional view of a portion of a prior art transistor 34. Transistor 34 includes a semiconductor substrate 36 having an intrinsic active device region 38, e.g., a FET, formed therein, represented generally by a dashed line box. The details of active device region 38 are known to those skilled in the art and are therefore not described herein for brevity. It bears repeating that although a FET design may be discussed herein, a wide variety of unipolar and bipolar transistor technologies may alternatively be implemented.

An interconnect structure 40 is formed on an upper surface 42 of semiconductor substrate 36. In general, interconnect structure 40 of transistor 34 includes a plurality of interdigitated first and second runners, i.e., drain and gate runners 44, 46. Additionally, interconnect structure 40 may include a plurality of shield runners 48 interposed between each drain and gate runners 44, 46. Only a single drain runner 44, two gate runners 46, and two shield runners 48 are shown in the side sectional view of FIG. 2 for simplicity of illustration. It should be understood however, that transistor 34 may include the multiplicity of drain, gate, and shield runners as represented by transistor 20 in FIG. 1. Additionally, gate electrodes may be structured on opposing sides of drain runners 44 as also shown in FIG. 1.

Interconnect structure 40 may be formed of multiple layers of dielectric material and electrically conductive material. In the illustrated example, a bottommost first conductive layer 50 (represented by dark upwardly and rightwardly directed narrow hatching) is suitably formed on upper surface 42 of semiconductor substrate 36 to include bottom tap segments 52 (two shown) electrically connected to gate electrodes 54 by way of electrically conductive vias 56. Additionally, first conductive layer 50 includes bottom drain segments 58 (one shown) electrically connected to a drain region 60 by way of an electrically conductive via 62. Source through-silicon-vias (TSVs) 64 extend through substrate 36 and may be in electrical contact with tap segments 52. Of course, other structures may be formed within semiconductor substrate 36 and on upper surface 42 of semiconductor substrate 36 that are not illustrated herein for simplicity. A bottommost first dielectric material layer 66 is formed over first conductive layer 50. Electrically conductive vias 68 may be suitably formed extending through first dielectric material layer 66.

A second electrically conductive layer 70 (represented by downwardly and rightwardly directed wide hatching) is suitably formed on first dielectric material layer 66. Second electrically conductive layer 70 includes tap interconnect segments 72, a drain segment 74, and shield segments 76. A second dielectric material layer 78 is formed over tap interconnect segments 72, drain segment 74, and shield segments 76 of second electrically conductive layer 70 and electrically conductive vias 80 may be suitably formed extending through second dielectric material layer 78.

A third electrically conductive layer 82 (represented by rightwardly and upwardly directed narrow hatching) is formed on second dielectric material layer 78. Third electrically conductive layer 82 includes tap interconnect segments 84, a drain segment 86, and shield segments 88. A third dielectric material layer 90 is formed over tap interconnect segments 84, drain segment 86, and shield segments 88, and electrically conductive vias 92 may be suitably formed extending through third dielectric material layer 90.

A fourth electrically conductive layer 94 (represented by rightwardly and upwardly directed wide hatching) is formed on third dielectric material layer 90. Gate runners 46 and main gate tap transmission lines 96 extending from gate runners 46 are formed in fourth electrically conductive layer 94. Thus, collectively, bottom tap segment 52, one or more vias 68, tap interconnect segment 72, one or more vias 80, tap interconnect segment 84, one or more vias 92, and main gate tap transmission lines 96 yield individual tap interconnects 98 extending through interconnect structure 40 between gate electrodes 54 and gate runners 46. A drain segment 100 and shield segments 102 are also formed in fourth electrically conductive layer. A fourth dielectric material layer 104 is formed over main gate transmission lines 96, gate runners 46, drain segment 100, and shield segments 102 of fourth electrically conductive layer 94, and electrically conductive vias 106 may be suitably formed extending through fourth dielectric material layer 104.

A fifth electrically conductive layer 108 (represented by rightwardly and downwardly directed narrow hatching) is formed on fourth dielectric material layer 104. In this example, drain runner 44 and shield runners 48 are formed in fifth electrically conductive layer 108. Thereafter, a passivation layer 110 may be formed over drain runner 44 and shield runners 48. Thus, collectively, a combination of drain segment 58, one or more vias 68, drain segment 74, one or more vias 80, drain segment 86, one or more vias 92, drain segment 100, and one or more vias 106 yields a drain pillar 112 that electrically interconnects drain region 60 of intrinsic active device region 38 to drain runner 44. Similarly, collectively, a combination of shield segments 76 connected to one or more conductive vias 80, one of shield segments 88 connected to one or more conductive vias 92, and one of shield segments 102 connected to one or more conductive vias 106 yields an interconnect shield structure 114 (two shown) that is electrically connected to one of shield runners 48.

Interconnect shield structures 114 may be laterally spaced apart from and located on opposing sides of drain pillar 112. Further, interconnect shield structures 114 are interposed between drain pillar 112 and tap interconnects 98. Gate electrodes 54 of active device region 38 are driven by an input signal tapped from gate runners 46 via tap interconnects 98. Interconnect shield structures 114 formed in interconnect structure 40 may block an electric field between tap interconnects 98 and drain pillar 112 to reduce the feedback capacitance caused by the proximity of tap interconnects 98 to drain pillar 112.

Figure 3:
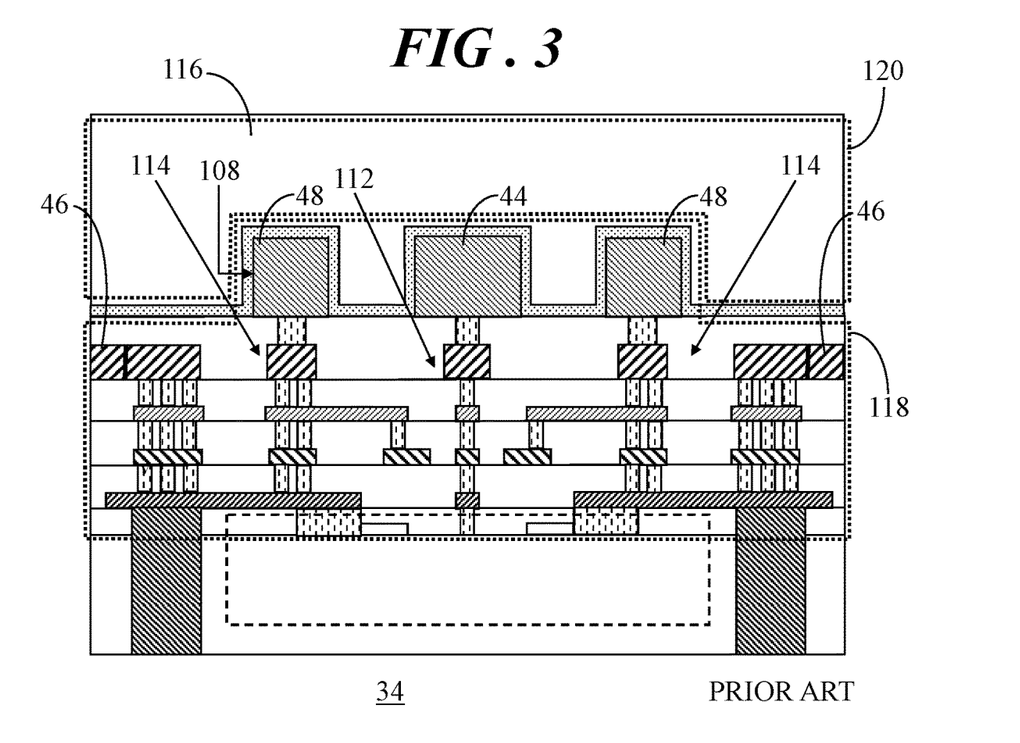
FIG. 3 shows a side sectional view of the portion of the prior art transistor following encapsulation with an encapsulating material.

Referring now to FIG. 3, FIG. 3 shows a side sectional view of the portion of the prior art transistor 34 following encapsulation with an encapsulating material 116. Typically, a transistor die (e.g., transistor 34) and other active and passive devices are mounted to a substrate (such as a carrier, lead frame, printed circuit board, and so forth) to yield a multi-function module or system (e.g., a power amplifier). In the example of a power amplifier, the system is tuned prior to encapsulation since tuning may require access to matching elements of the system. That is, a power amplifier may be tuned to a specific frequency or a narrow band of radio frequencies for optimal performance utilizing matching elements. Accordingly, encapsulation using the encapsulating material 116 is performed after, for example, tuning a power amplifier that includes transistor 34. Encapsulating material 116 may be a plastic encapsulant such as that commonly used for high volume overmolded integrated circuits or other materials demonstrating dielectric properties.

As mentioned previously, feedback from the drain to gate degrades the performance of transistors. As such, multiple shields, such as interconnect shield structure 114, field plates, ground shields, and the like exist in RF transistors between the drain and gate up to the top metal layer (e.g., up to fifth electrically conductive layer 108 in this example). However, another source of performance degradation and detuning comes from the encapsulating material above the top metal layer, sometimes referred to as the plastic encapsulation effects. That is, the encapsulating material causes a significant amount of coupling between the drain and gate, in addition to some drain-to-source coupling and gate-to-source coupling.

In FIG. 3, a first dotted line box represents a region of effectiveness 118 of the existing shield(s), such as interconnect shield structure 114. A second dotted line box represents a region of coupling 120 due to the presence of encapsulating material 116. This coupling due to encapsulating material 116 can adversely affect the performance of transistor 34 in terms of gain and stability. Embodiments described herein include features added inside of the transistor die to reduce the adverse plastic encapsulation effects on die performance. The features may improve the immunity of the transistor to coupling between the drain and gate caused by the encapsulating material by raising the interface between the encapsulating material and the transistor away from the coupling electrodes (e.g., away from drain and gate runners 44, 46).

Figure 4:
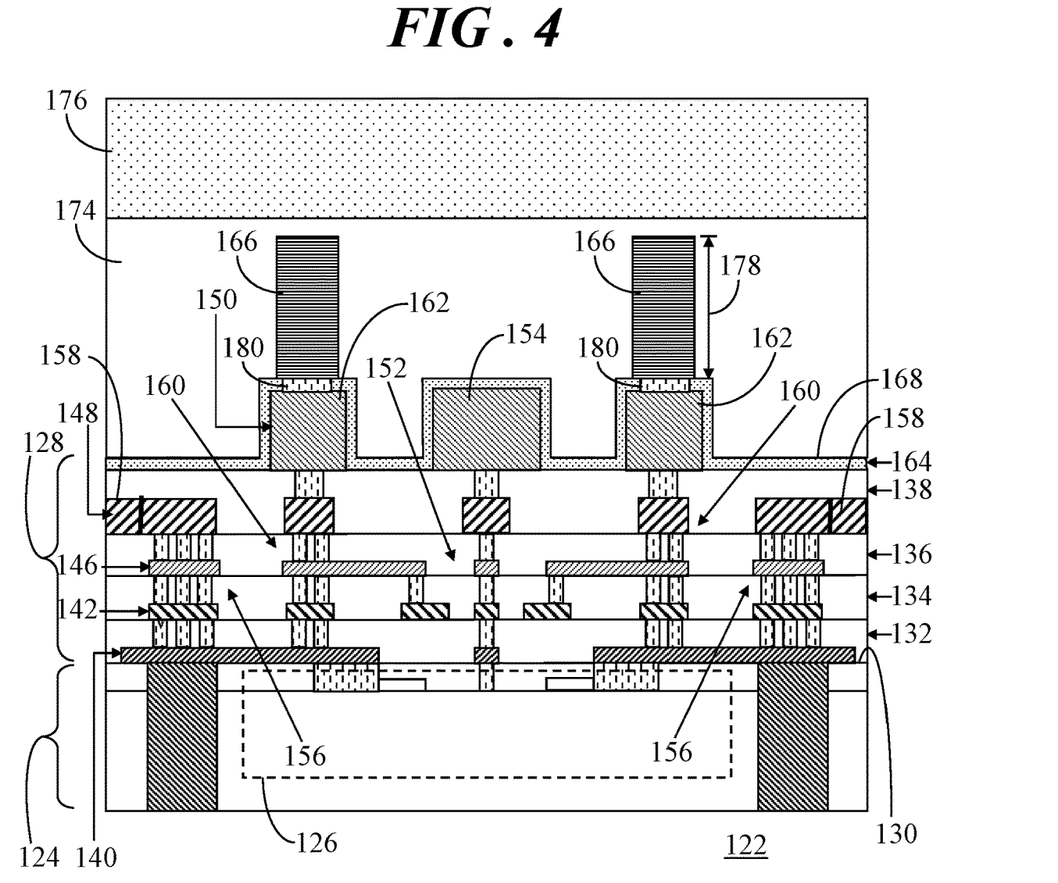
FIG. 4 shows a side sectional view of a portion of a transistor in accordance with an embodiment.
Figure 5:
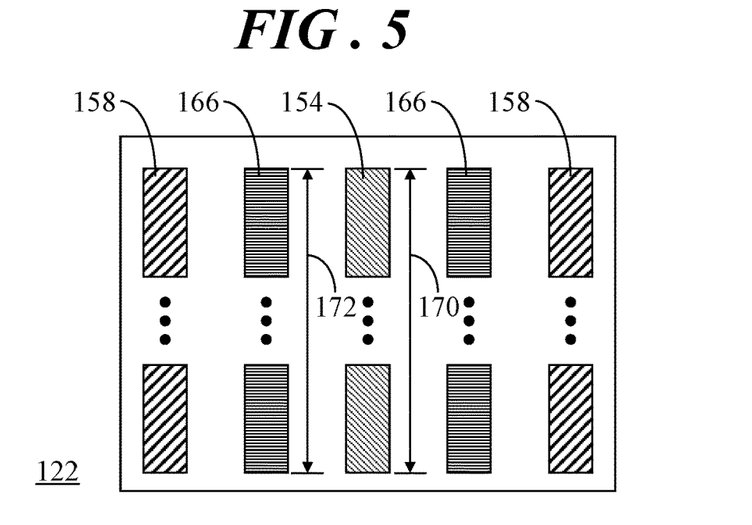
FIG. 5 shows a pictorial plan view of a portion of the transistor of FIG. 4.

Referring to FIGS. 4 and 5, FIG. 4 shows a side sectional view of a portion of a transistor 122 in accordance with an embodiment and FIG. 5 shows a pictorial plan view of a portion of the transistor 122. Transistor 122 includes a semiconductor substrate 124 having a device region 126 formed therein. An interconnect structure 128 is formed on a first outer surface 130 of semiconductor substrate 124. Interconnect structure 128 is formed of multiple layers of dielectric material 132, 134, 136, 138 and multiple layers of electrically conductive material 140, 142, 146, 148, 150. For simplicity of illustration, transistor 122 is similar to transistor 34 (FIG. 2). Hence, transistor 122 includes drain pillars 152 (one shown) electrically connected to a drain runner 154 and tap interconnects 156 electrically connected to gate runners 158. Further, in this example, interconnect shield structures 160, electrically connected to shield runners 162, are interposed between tap interconnects 156/gate runners 158 and drain pillars 152/drain runner 154. At least one passivation layer 164 may be deposited over drain runner 154 and shield runners 162. Passivation layer 164 may be a single material layer, or passivation layer 164 may include more than one material layer, such as an oxide layer and a nitride layer.

Additional features and segments of the various features formed of the multiple layers of electrically conductive material 140, 142, 146, 148, 150 and extending through the multiple layers of dielectric material 132, 134, 136, 138 of interconnect structure 128 are not described in detail herein since transistor 122 resembles transistor 34 of FIG. 2. Further, only a single drain runner 154, two gate runners 158, and two shield runners 162 are shown in the side sectional view of transistor 122 in FIG. 4 for simplicity of illustration. It should be understood however, that transistor 122 may be configured to include the multiplicity of drain, gate, and shield runners as represented by transistor 20 in FIG. 1. Still further, transistor 122 provides an example of a configuration the includes five electrically conductive layers in interconnect structure 128 (sometimes referred to as a five metal layer structure) for illustrative purposes. However, it should be understood that a wide variety of alternative transistor structures having more than or less than the five conductive layers may be envisioned.

Transistor 122 further includes a shield structure 166 extending above a second outer surface 168 of interconnect structure 128. In the illustrated embodiment, shield structure 166 is formed on passivation layer 164. As such, second outer surface 168 is the exposed upper surface of passivation layer 164. Shield structures 166 (two shown) are formed from an electrically conductive material. For example, shield structures 166 may be formed from copper in some configurations. However, other suitable materials may alternatively be utilized to form shield structures 166.

As particularly represented in FIG. 5, drain and gate runners 154, 158 are characterized by a first length 170 and shield structures 166 are characterized by a second length 172. Second length 172 of shield structures 166 is longitudinally aligned with first length 170 of drain and gate runners 154, 158. FIG. 5 is shown in a highly simplified form without the various overlying layers so that drain and gate runners 154, 158 and shield structure 166 are exposed in order to visualize their parallel orientation relative to one another. Ellipses denote that drain and gate runners 154, 158 and shield structures 166 may extend any suitable length in accordance with a particular transistor design. Further terminations are not specifically illustrated in association with drain, gate, and shield runners 154, 158, 166 to denote that they may be terminated in a variety of configurations in accordance with a particular transistor design.

Transistor 122 further includes a dielectric protective coating 174 formed over second outer surface 168 of interconnect structure 128. Further, dielectric protective coating 174 encapsulates shield structures 166. Dielectric protective coating 174, formed over second outer surface 168 of interconnect structure 128 and encapsulating shield structures 166, is represented in FIG. 4 as being generally level or planar. However, in other embodiments, dielectric protective coating 174 may not be planar and may, instead, follow the topography of second outer surface 168 and shield structures 166. Dielectric protective coating 174 may be a benzocyclobutene (BCB) low loss dielectric material. However, other suitable materials may alternatively be implemented as dielectric protective coating 174.

In FIG. 4, transistor 122 is further illustrated with an enclosure material, such as an encapsulating material 176 overlaying dielectric protective coating 174. As discussed above, a transistor die (e.g., transistor 122) may be incorporated into a packaged device such as a multi-function module or system. Further, the system may be tuned prior to encapsulation so that matching elements of the system may be accessed. Accordingly, FIG. 4 represents a condition in which transistor 122 is incorporated into a system, and transistor 122 has been overmolded with encapsulating material 176 following system tuning. Shield structures 166 are formed by an electrically conductive material layer higher than drain runner 154. That is, shield structures 166 extend above second outer surface 168 of interconnect structure 128 at a height 178 sufficient to reduce parasitic capacitance between drain and gate runners 154, 156 resulting from plastic coupling by encapsulating material 146. Additionally, in some embodiments, dielectric protective coating 174 raises encapsulating material 176 relatively far away from drain and gate runners 154, 158 to further reduce the electric coupling between them.

An encapsulant, such as an overmolded plastic encapsulating material 176, is discussed herein. However, in alternative embodiments, the enclosure material may be a cap material having an air cavity. In such a configuration, the presence of shield structures 166 may also reduce parasitic capacitance between drain and gate runners 154, 156 in an air cavity package.

In some embodiments, shield structures 166 are electrically connected to a source node. In the illustrated embodiment, electrically conductive vias 180 are formed extending through passivation layer 164 prior to deposition of dielectric protective coating. That is, portions of passivation layer 164 are absent from shield runners 162 to expose shield runners 162. Conductive vias 180 are formed in these openings through passivation layer 164 to electrically connect shield structures 166 to shield runners 162 and interconnect shield structures 160. Further, during the fabrication of interconnect structure 128, interconnect shield structures 160 may be suitably connected to a system ground. Thus, conductive vias 180 may be considered a source node for shield structures 166. However, interconnect shield structures 160 may be electrically connected to ground by way of other mechanisms, discussed below.

Figure 6:
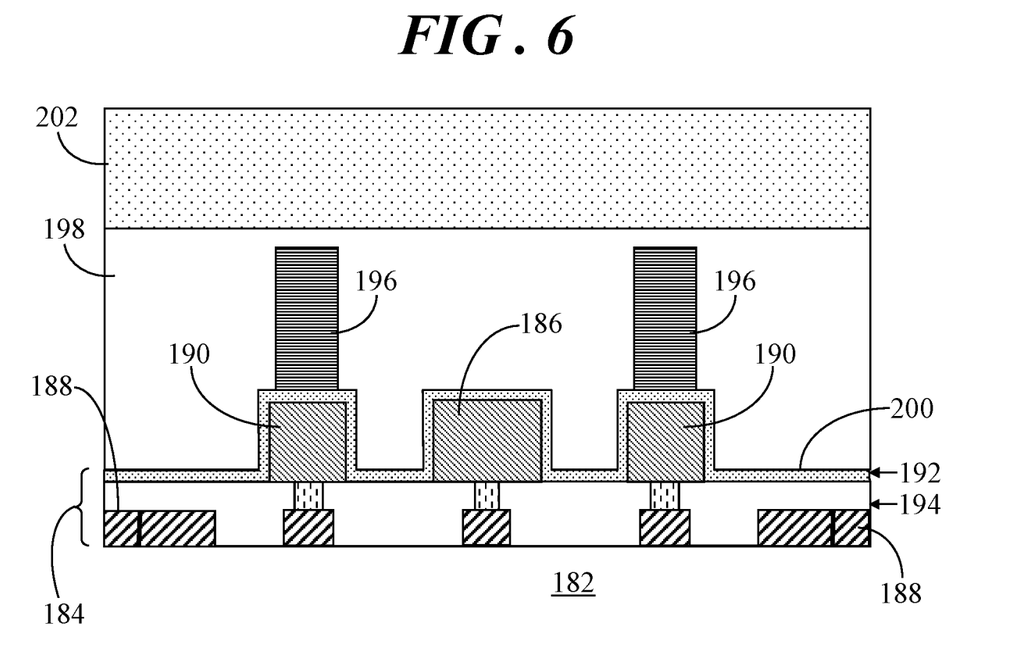
FIG. 6 shows a side sectional view of a portion of a transistor in accordance with another embodiment.
Figure 7:
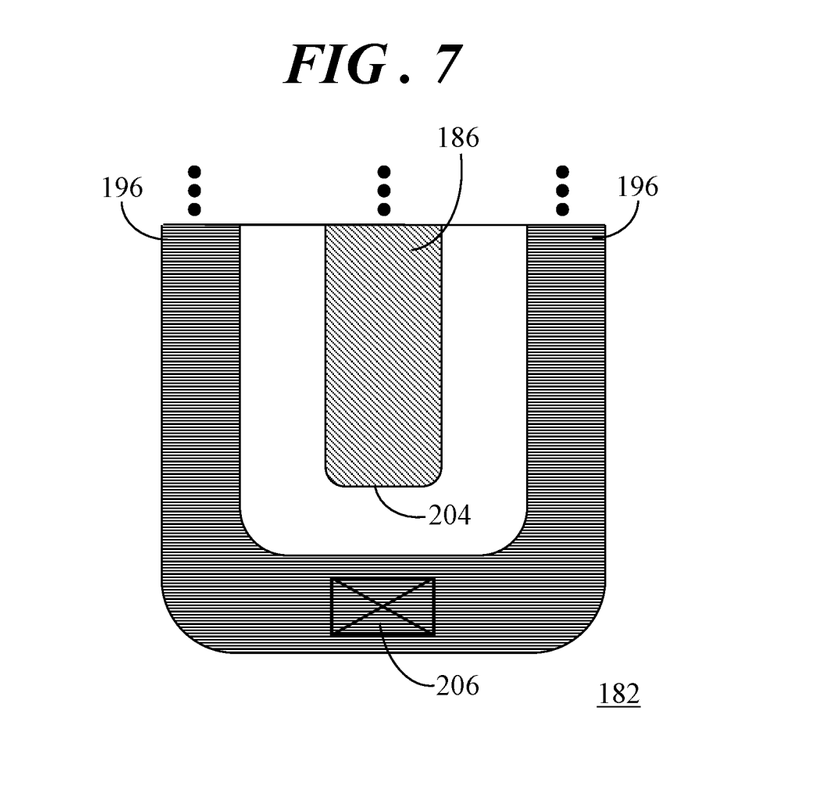
FIG. 7 shows a pictorial plan view of another portion of the transistor of FIG. 5.

Referring to FIGS. 6 and 7, FIG. 6 shows a side sectional view of a portion of a transistor 182 in accordance with another embodiment and FIG. 7 shows a pictorial plan view of another portion of transistor 182. Transistor 182 can include many of the features described above in connection with transistor 122 (FIGS. 4 and 5). Thus, transistor 182 can include a semiconductor substrate (not shown) and an interconnect structure 184 (only a portion of which is shown). In this illustrated configuration, transistor 182 again includes drain runners 186 (one shown), gate runners 188 (two shown), and shield runners 190 (two shown). A passivation layer 192 is deposited over drain runner 186, shield runners 190, and a topmost dielectric layer 194 of interconnect structure 184. Shield structures 196 are formed on passivation layer 192 overlying shield runners 190. A dielectric protective coating 198 is formed over a second outer surface 200 of interconnect structure 184. That is, dielectric protective coating 198 is formed on passivation layer 192 and encapsulates shield structures 196. Further, an encapsulating layer 202 is formed over dielectric protective coating 198.

As opposed to the configuration of transistor 122 (FIGS. 4-5), conductive vias are not formed through passivation layer 192 of transistor 182 to electrically interconnect shield structures 196 to their corresponding shield runners 190. Instead, as particularly represented in FIG. 7, shield structures 196 may extend beyond a drain end 204 of drain runner 186. Shield structures 196 generally wrap around drain end 204 of drain runner 186 and converge at a source node 206. Source node 206 may extend through interconnect structure 184 to connect to, for example, a ground plane (not shown) of transistor 182 so that shield structures 196 are electrically connected to ground. FIG. 7 is shown in a highly simplified form without the various overlying layers so that drain runner 186 and shield structures 196 are exposed to visualize their orientation relative to one another and to visualize source node 206. Ellipses denote that drain runner 186 and shield structures 196 may extend any suitable length in accordance with a particular transistor design.

Figure 8:
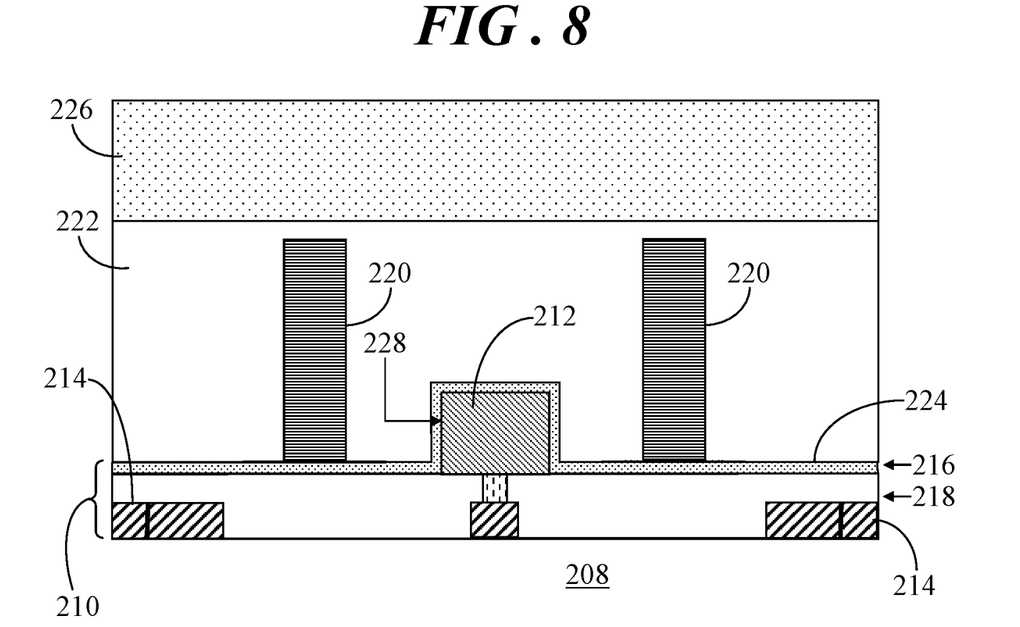
FIG. 8 shows a side sectional view of a portion of a transistor in accordance with another embodiment.

FIG. 8 shows a side sectional view of a portion of a transistor 208 in accordance with another embodiment. Transistor 208 can include many of the features described above in connection with transistor 122 (FIGS. 4 and 5) and transistor 182 (FIGS. 6 and 7). Thus, transistor 208 can include a semiconductor substrate (not shown) and an interconnect structure 210 (only a portion of which is shown). In this illustrated configuration, transistor 208 includes drain runners 212 (one shown) and gate runners 214 (two shown). However, the configuration of transistor 208 does not include shield runners. A passivation layer 216 is deposited over drain runner 212 and a topmost dielectric layer 218 of interconnect structure 210. Shield structures 220 are formed on passivation layer 216 and are positioned between drain and gate runners 212, 214. A dielectric protective coating 222 is formed over a second outer surface 224 of interconnect structure 210. That is, dielectric protective coating 222 is formed on passivation layer 216 and encapsulates shield structures 220. Further, an encapsulating material 226 is formed over dielectric protective coating 222.

FIG. 8 is provided to demonstrate a configuration that does not include shield runners in a topmost electrically conductive layer 228 of interconnect structure 210. Instead, interconnect structure 210 may be formed with a different interconnect shield structure (not shown) that is not routed to topmost conductive layer 228. Alternatively, interconnect structure 210 may not include a multi-segmented interconnect shield structure as shown in FIG. 4 (e.g., interconnect shield structures 160 of FIG. 4). Nevertheless, the presence of shield structures 220 suitably positioned between drain and gate runners 212, 214 and extending above drain runner, as well as dielectric protective coating 222 may reduce the electric coupling between drain and gate runners 212, 214 resulting from encapsulating material 226.

Figure 9:
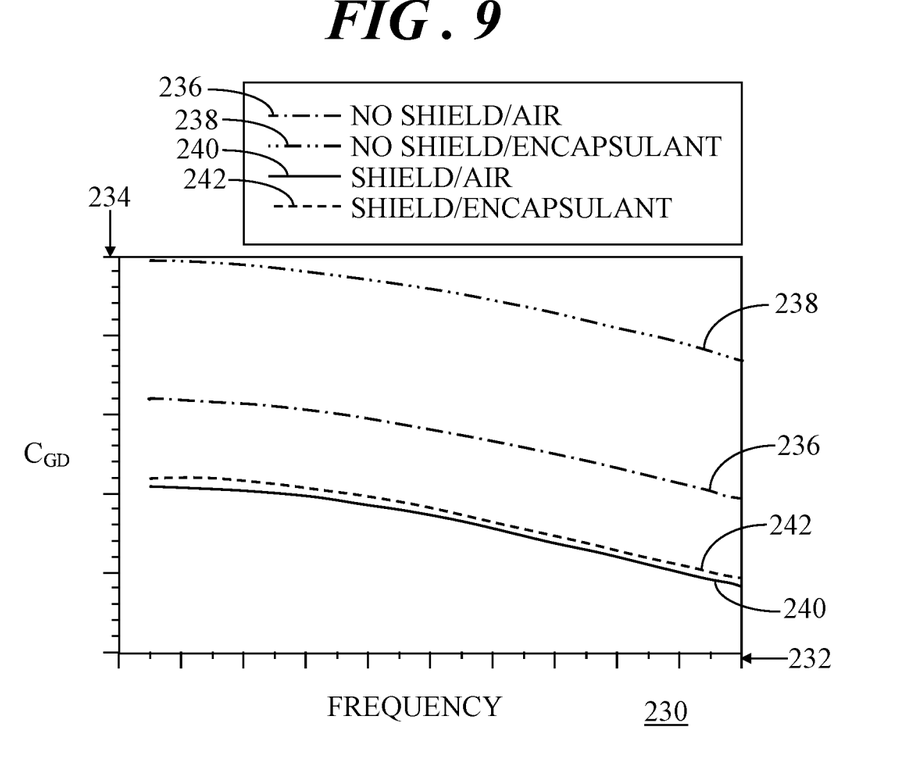
FIG. 9 shows a graph of the generalized differences of parasitic capacitances with respect to frequency between a prior art transistor and a transistor in accordance with an embodiment.

FIG. 9 shows a graph 230 of generalized differences of parasitic capacitances with respect to frequency between a prior art transistor and a transistor in accordance with an embodiment. As such, a horizontal axis 232 of graph 230 represents frequency and a vertical axis 234 of graph 230 represents parasitic gate-to-drain capacitance ($C_{00}$). Graph 230 is presented to show the generalized differences in arbitrary units. Therefore, actual frequencies and measured parasitic capacitance are not provided.

A first curve 236, illustrated with a dash-dot line, represents the parasitic gate-to-drain capacitance over a range of frequencies for a prior art transistor (e.g., transistor 34 of FIG. 2) that has not yet been encapsulated with an encapsulating material (e.g., encapsulating material 116 of FIG. 3). Thus, the legend in FIG. 9 refers to first curve 236 as NO SHIELD/AIR which indicates that the transistor does not have a shield structure (e.g., shield structure 166 of FIG. 4, shield structure 196 of FIG. 6, or shield structure 220 of FIG. 8) positioned between the drain and gate runners, extending above the drain runners, and encapsulated by a dielectric protective coating (e.g., protective coating 174 of FIG. 4, protective coating 198 of FIG. 6, or protective coating 222 of FIG. 8).

A second curve 238, illustrated with a dash-dot-dot line, represents the parasitic gate-to-drain capacitance over the range of frequencies for the prior art transistor (e.g., transistor 34 of FIG. 2) after it has been encapsulated with an encapsulating material (e.g., encapsulating material 116 of FIG. 3). Thus, the legend in FIG. 9 refers to second curve 238 as NO SHIELD/ENCAPSULANT which also indicates that the transistor does not have a shield structure (e.g., shield structure 166 of FIG. 4, shield structure 196 of FIG. 6, or shield structure 220 of FIG. 8) positioned between the drain and gate runners, extending above the drain runners, and encapsulated by a dielectric protective coating (e.g., protective coating 174 of FIG. 4, protective coating 198 of FIG. 6, or protective coating 222 of FIG. 8). However, the transistor has now been encapsulated in an encapsulating material following system tuning. Second curve 238 relative to first curve 236 demonstrates the significant increase in parasitic gate-to-drain capacitance due to the encapsulation material.

A third curve 240, illustrated with a solid line, represents the parasitic gate-to-drain capacitance over the range of frequencies for a transistor in accordance with an embodiment (e.g., transistor 122 of FIG. 4, transistor 182 of FIG. 6, or transistor 208 of FIG. 8) that has not yet been encapsulated with an encapsulating material (e.g., encapsulating material 176 of FIG. 4, encapsulating material 202 of FIG. 6 or encapsulating material 226 of FIG. 8). Thus, the legend in FIG. 9 refers to third curve 240 as SHIELD/AIR indicating that the transistor includes a shield structure (e.g., shield structure 166 of FIG. 4, shield structure 196 of FIG. 6, or shield structure 220 of FIG. 8) positioned between the drain and gate runners, extending above the drain runners, and encapsulated by a dielectric protective coating (e.g., protective coating 174 of FIG. 4, protective coating 198 of FIG. 6, or protective coating 222 of FIG. 8). It can be observed that the presence of the shield structure and dielectric protective coating effectively reduces the parasitic gate-to-drain capacitance prior to encapsulation of the transistor with the encapsulating material.

A fourth curve 242, illustrated with a dashed line, represents the parasitic gate-to-drain capacitance over the range of frequencies for a transistor in accordance with an embodiment (e.g., transistor 122 of FIG. 4, transistor 182 of FIG. 6, or transistor 208 of FIG. 8) following encapsulation with an encapsulating material (e.g., encapsulating material 176 of FIG. 4, encapsulating material 202 of FIG. 6, or encapsulating material 226 of FIG. 8). Thus, the legend in FIG. 9 refers to fourth curve 242 as SHIELD/ENCAPSULANT indicating that the transistor includes a shield structure (e.g., shield structure 166 of FIG. 4, shield structure 196 of FIG. 6, or shield structure 220 of FIG. 8) positioned between the drain and gate runners and the transistor has now been encapsulated in an encapsulating material following system tuning. Fourth curve 242 relative to third curve 240 demonstrates very little difference in parasitic gate-to-drain capacitance prior to or following encapsulation in the encapsulating material. However, both instances of third and fourth curves 240, 242 demonstrate a significant decrease in parasitic capacitance relative to first and second curves. It has also been observed that any parasitic gate-to-shield capacitance (CGs) and drain-to-shield capacitance (CDs) following encapsulation with encapsulating material have non-significant changes. Thus, the presence of the shield structure positioned between the drain and gate runners and extending above the drain runner can significantly reduce electric coupling between the gate and the drain resulting from the encapsulating material to improve transistor gain and stability.

Figure 10:
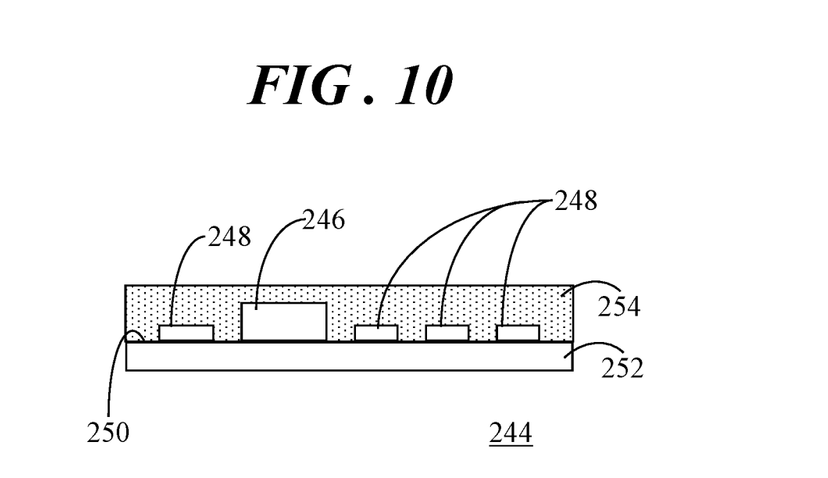
FIG. 10 shows a top view of a highly simplified packaged device in accordance with another embodiment.

FIG. 10 shows a top view of a highly simplified packaged device 244 in accordance with another embodiment. Packaged device 244 may be any system or any multi-function module that includes at least one transistor 246 in accordance with the above embodiments and other active and passive discrete components 248 that are electrically connected via wirebonds, bond pads, and so forth, not shown for simplicity. For example, packaged device 244 may be a radio frequency integrated circuit die used in modules (e.g., system-on-package), discrete, and integrated circuit products. Transistor 246 may be any of the transistors described above (e.g., transistor 122 of FIG. 4, transistor 182 of FIG. 6, transistor 208 of FIG. 8) or any variant thereof that includes shield structures formed above the interconnect structure. Additionally, transistor 246 may be implemented in a multiplicity of transistor technologies, such as laterally diffused metal oxide semiconductor (LDMOS), gallium nitride (GaN), gallium arsenide (GaAs), silicon-germanium (SiGe), and so forth.

In some configurations, transistor 246 and discrete components 248 may be suitably coupled to a mounting surface 250 of a substrate 252 and interconnected with one another per a particular design. Following their coupling to substrate 252 and their interconnection, the components of packaged device 244 may be tuned, calibrated, or otherwise tested. Thereafter, transistor 246 and discrete components 248 are encapsulated using an encapsulating material 254 to form packaged device 244. Since the transistor 246 includes shield structures above the drain and gate of the transistor and further includes the dielectric protective coating, a plastic encapsulation material (e.g., encapsulating material 254) is raised relatively far away from the gate and drain runners, thereby reducing electric coupling between the gate and drain. Such a configuration may advantageously enable design/tuning of "air" transistors (no encapsulating material) without redesign/tuning for "plastic" transistors (encapsulated transistors).

Figure 11:
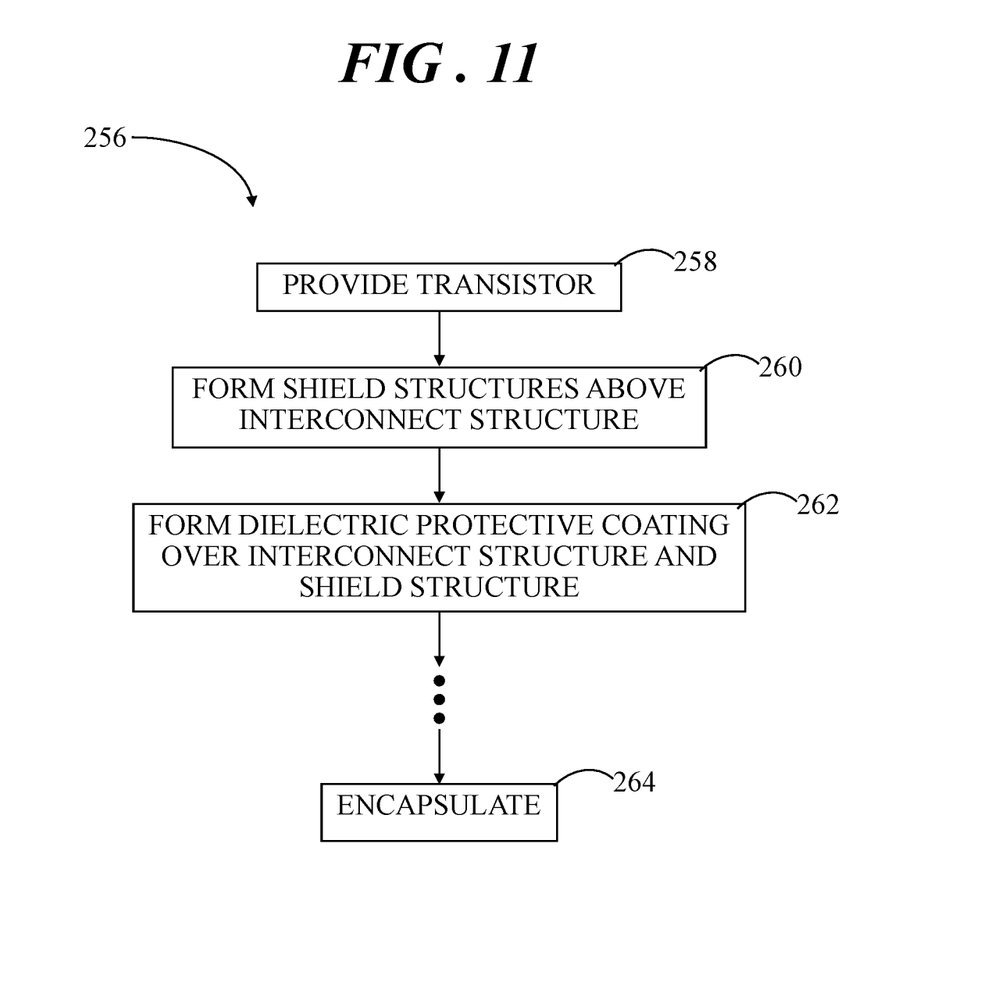
FIG. 11 shows a flowchart of a manufacturing process in accordance with another embodiment.

FIG. 11 shows a flowchart of a manufacturing process 256 in accordance with another embodiment. Process 256 may be implemented to form a discrete transistor having suitably formed shield structures above the drain and gate of the transistor (e.g., transistor 122 of FIG. 4) or to form a packaged system or multi-function module (e.g., packaged device 244 of FIG. 10). The following process flow is described in term of a single transistor and packaged device. Those skilled in the art will recognize that high volume manufacturing processes may entail concurrent manufacturing of a multiplicity of transistors on a single wafer and/or a multiplicity of packaged devices.

At a block 258, a transistor is provided. That is, a semiconductor substrate may be provided having an active device region formed therein and an interconnect structure formed on a surface of the semiconductor substrate. Again, the interconnect structure may be formed of multiple layers of dielectric material and electrically conductive material, and one or more gate runners and one or more drain runners may be formed in the interconnect structure.

At a block 260, shield structures are formed above the interconnect structure, as discussed in detail above in connection with the embodiments of FIGS. 4-8. Thus, the shield structures may be formed along a length of the gate and drain runners. Additionally, the shield structure may be formed to extend above the outer surface of the interconnect structure at a height sufficient to reduce a parasitic capacitance between the drain and gate runners.

At a block 262, the dielectric protective coating is formed over the exposed outer surface of the interconnection structure. Formation of the dielectric protective coating entails encapsulating the shield structures with the dielectric protective coating. The dielectric protective coating may be a benzocyclobutene (BCB) low loss dielectric material. However, other suitable materials may alternatively be implemented as the dielectric protective coating.

Ellipses follow block 262 of manufacturing process 256 to indicate that a number of process operations may be performed following forming the dielectric protective coating in accordance with a particular process flow. These operations may entail mounting the transistor and other discrete devices to a substrate (e.g., carrier, PCB, leadframe, and so forth), forming interconnections, tuning/calibration/testing, the device and so forth.

Thereafter, a block 264 may be performed. At block 264, the discrete transistor or the system of functional circuits may be suitably encapsulated with an encapsulating material. The encapsulating material may be a plastic (e.g., epoxy) overmold or a dispensed epoxy encapsulant deposited over the transistor and functional circuits. Following block 264, manufacturing process 256 may end. Alternatively, other process operations may follow block 264, such as curing the encapsulating material, testing, further packaging, and so forth, that are not shown for brevity.

Embodiments described herein entail a transistor having a shield structure formed above an interconnect structure of the transistor, a packaged device having such a transistor, and a method of manufacturing that includes the transistor. An embodiment of a transistor comprises a semiconductor substrate having an active device region formed therein, an interconnect structure on a first surface of the semiconductor substrate, the interconnect structure being formed of multiple layers of dielectric material and electrically conductive material, wherein a drain runner and a gate runner are formed in the interconnect structure, and a shield structure extending above a second surface of the interconnect structure, the shield structure being positioned between the drain and gate runners.

An embodiment of a packaged device comprises a substrate with a mounting surface and a transistor coupled to the mounting surface of the substrate. The transistor includes a semiconductor substrate having an active device region formed therein, an interconnect structure on a first surface of the semiconductor substrate, the interconnect structure being formed of multiple layers of dielectric material and electrically conductive material, wherein a drain runner and a gate runner are formed in the interconnect structure, and a shield structure extending above a second surface of the interconnect structure, the shield structure being positioned between the drain and gate runners. The transistor further includes a dielectric protective coating formed over the second surface of the interconnect structure, the shield structure being encapsulated by the dielectric protective coating and an encapsulating layer formed overlying the dielectric protective coating.

An embodiment of a method comprises providing a semiconductor substrate having an active device region formed therein and an interconnect structure formed on a first surface of the semiconductor substrate, the interconnect structure being formed of multiple layers of dielectric material and electrically conductive material, wherein a drain runner and a gate runner are formed in the interconnect structure. The method further comprises forming a shield structure extending above a second surface of the interconnect structure, the shield structure being positioned between the drain and gate runners.

Accordingly, embodiments can include multiple shield structures formed by an electrically conductive layer strategically located above the interconnect structure between drain and gate runners of a multiple runner interdigitated transistor. The shield structures are covered by a dielectric protective coating. Thereafter, the transistor can be encapsulated with an encapsulating material during integrated circuit packaging. The presence of the shield structures and dielectric protective coating raises the encapsulating material away from the gate and drain runners, thereby reducing electric coupling between the gate and drain runners. The integration of the shield structure may effectively increase the gain of the active device (e.g., transistor) without degrading stability by reducing feedback capacitance between the drain and gate runners.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A transistor comprising:
a semiconductor substrate having an active device region formed therein;
an interconnect structure on a first surface of the semiconductor substrate, the interconnect structure being formed of multiple layers of dielectric material and electrically conductive material, wherein a drain runner and a gate runner are formed in the interconnect structure, and the drain and gate runners are characterized by a first length; and
a shield structure extending above a second surface of the interconnect structure, the shield structure being positioned between the drain and gate runners, the shield structure is characterized by a second length, the second length of the shield structure being longitudinally aligned with the first length of the drain and gate runners.

2. The transistor of claim 1 wherein the shield structure is formed from an electrically conductive material.

3. The transistor of claim 1 wherein the shield structure is electrically connected to a source node.

4. The transistor of claim 1 further comprising a dielectric protective coating formed over the second surface of the interconnect structure, the shield structure being encapsulated by the dielectric protective coating.

5. The transistor of claim 4 further comprising an enclosure material overlying the dielectric protective coating.

6. The transistor of claim 1 further comprising a shield runner formed in the interconnect structure, the shield runner being positioned between the drain and gate runners, wherein the shield structure is formed on the shield runner.

7. A transistor comprising:
a semiconductor substrate having an active device region formed therein;
an interconnect structure on a first surface of the semiconductor substrate, the interconnect structure being formed of multiple layers of dielectric material and electrically conductive material, wherein a drain runner, a gate runner, and a shield runner are formed in the interconnect structure, the shield runner being positioned between the drain and gate runners, and wherein the interconnect structure includes at least one passivation layer at the second surface of the interconnect structure, a portion of the at least one passivation layer being absent from the shield runner to expose the shield runner; and
a shield structure extending above a second surface of the interconnect structure, the shield structure being positioned between the drain and gate runners, and the shield structure being formed on the shield runner, and wherein the shield structure is electrically connected to the shield runner.

8. The transistor of claim 1 wherein the interconnect structure includes at least one passivation layer at the second surface of the interconnect structure, wherein the shield structure is formed on the at least one passivation layer.

9. A packaged device comprising:
a substrate with a mounting surface; and
a transistor coupled to the mounting surface of the substrate, the transistor including:

a semiconductor substrate having an active device region formed therein;

an interconnect structure on a first surface of the semiconductor substrate, the interconnect structure being formed of multiple layers of dielectric material and electrically conductive material, wherein a drain runner and a gate runner are formed in the interconnect structure, and the drain and gate runners are characterized by a first length;

a shield structure extending above a second surface of the interconnect structure, the shield structure being positioned between the drain and gate runners, the shield structure is characterized by a second length, the second length of the shield structure being longitudinally aligned with the first length of the drain and gate runners;

a dielectric protective coating formed over the second surface of the interconnect structure, the shield structure being encapsulated by the dielectric protective coating; and an enclosure material formed overlying the dielectric protective coating.

10. The packaged device of claim 9 wherein the shield structure is formed from an electrically conductive material.

11. The packaged device of claim 9 wherein the shield structure is electrically connected to a source node of the transistor.

12. A method comprising:

providing a semiconductor substrate having an active device region formed therein and an interconnect structure formed on a first surface of the semiconductor substrate, the interconnect structure being formed of multiple layers of dielectric material and electrically conductive material, wherein a drain runner and a gate runner are formed in the interconnect structure, the drain and gate runners are characterized by a first length; and forming a shield structure extending above a second surface of the interconnect structure, the shield structure being positioned between the drain and gate runners, the shield structure is characterized by a second length, the second length of the shield structure being longitudinally aligned with the first length of the drain and gate runners.

13. The method of claim 12 wherein the drain and gate runners are aligned parallel to one another, and the forming operation comprises forming the shield structure along a length of the drain and gate runners.

14. The method of claim 12 further comprising forming a dielectric protective coating over the second surface of the interconnect structure, the shield structure being encapsulated by the dielectric protective coating.

15. The method of claim 14 further comprising forming an enclosure material layer overlying the dielectric protective coating.

* * * * *